United States Patent
Zang et al.

(10) Patent No.: US 12,464,837 B2
(45) Date of Patent: Nov. 4, 2025

(54) HIGH DYNAMIC RANGE, BACKSIDE-ILLUMINATED, LOW CROSSTALK IMAGE SENSOR WITH WALLS ON BACKSIDE SURFACE TO ISOLATE PHOTODIODES

(71) Applicant: OmniVision Technologies, Inc., Santa Clara, CA (US)

(72) Inventors: Hui Zang, San Jose, CA (US); Gang Chen, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 559 days.

(21) Appl. No.: 17/592,370

(22) Filed: Feb. 3, 2022

(65) Prior Publication Data

US 2023/0282671 A1    Sep. 7, 2023

(51) Int. Cl.
*H10F 39/12*    (2025.01)
*H10F 39/00*    (2025.01)
*H10F 39/18*    (2025.01)

(52) U.S. Cl.
CPC ......... *H10F 39/199* (2025.01); *H10F 39/024* (2025.01); *H10F 39/182* (2025.01); *H10F 39/8053* (2025.01); *H10F 39/807* (2025.01); *H10F 39/811* (2025.01)

(58) Field of Classification Search
CPC ........... H01L 27/1464; H01L 27/14621; H01L 27/1463; H01L 27/14636; H01L 27/14645; H01L 27/14685; H01L 27/14623; H10F 39/199; H10F 39/807; H10F 39/182; H10F 39/8053; H10F 39/024; H10F 39/81; H10F 39/8057
See application file for complete search history.

(56) References Cited

U.S. PATENT DOCUMENTS

| | | | |
|---|---|---|---|
| 10,269,850 B2 | 4/2019 | Zheng et al. | |
| 10,811,453 B1 * | 10/2020 | Mun | H01L 27/1464 |
| 11,784,204 B2 * | 10/2023 | Tsai | H01L 27/14689 |
| | | | 257/291 |
| 2015/0263054 A1 * | 9/2015 | Chien | H01L 27/14623 |
| | | | 257/292 |
| 2015/0372033 A1 * | 12/2015 | Cheng | H01L 21/31116 |
| | | | 257/435 |
| 2018/0040661 A1 | 2/2018 | Lee et al. | |

* cited by examiner

*Primary Examiner* — Jessica S Manno
*Assistant Examiner* — Andrew Chung
(74) *Attorney, Agent, or Firm* — COZEN O'CONNOR (57) ABSTRACT

A backside-illuminated image sensor includes photodiodes in photodiode regions electrically isolated by filled trenches with openings in a dielectric layer over the photodiodes. The image sensor has a metal grid aligned over the trenches, the metal grid within 80 nanometers of the trenches. The image sensor is formed by: fabricating photodiodes in photodiode regions of a frontside of a silicon substrate with source-drain regions of transistors, the photodiodes electrically isolated by deep trenches, each photodiode within a photodiode region of the substrate; forming the filled trenches in a backside of the semiconductor substrate; forming protective oxide and process stop layers over the backside of the semiconductor substrate; depositing a metal grid over the deep trenches, removing the process stop layer from over photodiode regions; and depositing color filters over the photodiode regions.

18 Claims, 9 Drawing Sheets

HIGH DYNAMIC RANGE, BACKSIDE-ILLUMINATED, LOW CROSSTALK IMAGE SENSOR WITH WALLS ON BACKSIDE SURFACE TO ISOLATE PHOTODIODES

BACKGROUND

Backside-illuminated image sensors typically have layers of color filters on the backside of the image sensor, such that there is a color filter positioned between each photodiode and incident light and configured to filter incoming light before the incident light can interact with that photodiode. These color filters are typically arranged in a pattern; in some cameras a "Bayer" pattern of three color filters, such as a red color filter, two green color filters, and a blue color filter, or a red color filter, a clear color filter, a blue color filter, and a green color filter in a four-photodiode arrangement is used while hyperspectral cameras may have patterns involving more than three color filters organized in four, eight, twelve, or sixteen-photodiode patterns. Color sensing is achieved by determining differences in brightness measured by adjacent photodiodes having different color filters. If light reaches a photodiode without passing through a color filter of that photodiode but after the light has passed through color filters of adjacent photodiodes, this optical crosstalk can disrupt color contrast. If a hyperspectral camera is used to simultaneously image both a fluorescent stimulus light and fluorescent emissions light, this optical crosstalk can obscure detail in fluorescent emissions images.

To provide extended dynamic range, some backside-illuminated image sensors provide each pixel with two paired photodiodes, one of high-sensitivity and one of low-sensitivity. In operation, the low-sensitivity photodiodes are used to resolve pixel data in bright portions of an image, and the high-sensitivity photodiodes, which in some systems have greater surface area than the low-sensitivity photodiodes, resolve pixel data in dim or dark portions of the image. Some such backside-illuminated image sensors have light-attenuating filters positioned to filter light incident on the low-sensitivity photodiodes; if light reaches the low-sensitivity photodiodes without passing through the light-attenuating filters, this optical crosstalk may reduce dynamic range.

SUMMARY

In an embodiment, a backside-illuminated image sensor includes an array of photodiodes formed in a semiconductor substrate, each individual photodiode is electrically isolated from other photodiodes by isolation structures with a protective dielectric layer disposed on a backside of the semiconductor substrate between a metal grid on the backside of the semiconductor substrate and a backside surface of the semiconductor substrate such that crosstalk between adjacent photodiodes can be reduced. The metal grid is aligned over the isolation structures and defining a plurality of apertures aligning with respective light sensing regions of photodiodes. The protective dielectric layer has openings aligning with the plurality of apertures such that the sensitivity of each individual photodiodes is not affected by the protective dielectric layer.

In an embodiment, an image sensor, includes a first photodiode disposed in a semiconductor substrate; an isolation structure disposed in the semiconductor substrate adjacent the first photodiode, the isolation structure extending from a backside of the semiconductor substrate into the semiconductor substrate and electrically isolating the first photodiode and any adjacent devices; a metal grid disposed on the backside of the semiconductor substrate, the metal grid defining a first aperture aligning with the first photodiode, the metal grid being vertically aligned with the isolation structure; and a first dielectric layer disposed on the backside of the semiconductor substrate and between the metal grid and isolation structure, wherein the first dielectric layer has a first opening aligning with the first aperture.

In another embodiment, a method of fabricating a backside-illuminated image sensor includes: forming a trench from a backside surface of a semiconductor substrate and between a first photodiode and a second photodiode in the semiconductor substrate; depositing an oxide-based liner material layer to line the trench; depositing a first process stop layer into the trench on the oxide-based liner material layer and on the backside surface of the semiconductor substrate; depositing a filling material into the trench and on the backside surface of the semiconductor substrate forming an isolation structure; applying a chemical-mechanical polishing process to the backside surface of the semiconductor substrate to remove the filling material outside the trench on the backside surface of the semiconductor substrate; depositing a second process stop layer on the backside surface of the semiconductor substrate and on the first process stop layer; forming a metal grid on the second process stop layer, wherein the metal grid defines a first aperture aligning with the first photodiode and a second aperture aligning with the second photodiode; and removing portions of the second process stop layer within the first aperture and the second aperture of the metal grid.

DETAILED DESCRIPTION OF THE EMBODIMENTS

In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the terms "below" and "under" may encompass both an orientation of above and below. The device may be otherwise oriented (rotated ninety degrees or at other orientations) and the spatially relative descriptors used herein interpreted accordingly. In addition, it will also be understood that when a layer is referred to as being "between" two layers, it may be the only layer between the two layers, or one or more intervening layers may also be present.

The term isolation structure may refer to a structure disposed in between photodiodes in a pixel array for providing electrical and/or optical isolation between adjacent photodiodes. The isolation structure may be interconnected in a grid form following shape of photodiodes. The isolation structure may be an oxide-filled isolation trench structure, a metal-filled isolation structure or a combination thereof. The isolation structure may be a front-side deep trench isolation structure extending from a front side of a substrate toward a backside of the substrate or a backside deep trench isolation structure extending from the backside of the substrate toward the front side of the substrate.

Two-photodiode-per-pixel, backside-illuminated, image sensors may have their dynamic range increased by adding a neutral-density, light-absorbing, filter to reduce light sensitivity of small photodiode in each pair of two photodiodes. When imaging brightly-illuminated pixels of an image with this light-absorbing filter present, the Applicant have observed that some light leaks into the small photodiodes that has entered the image-sensor array through adjacent large photodiodes, causing crosstalk that limits dynamic range of the image sensor by inducing photocurrent in the small photodiodes, and even saturates small photodiodes during integration of image sensor.

Figure 1:
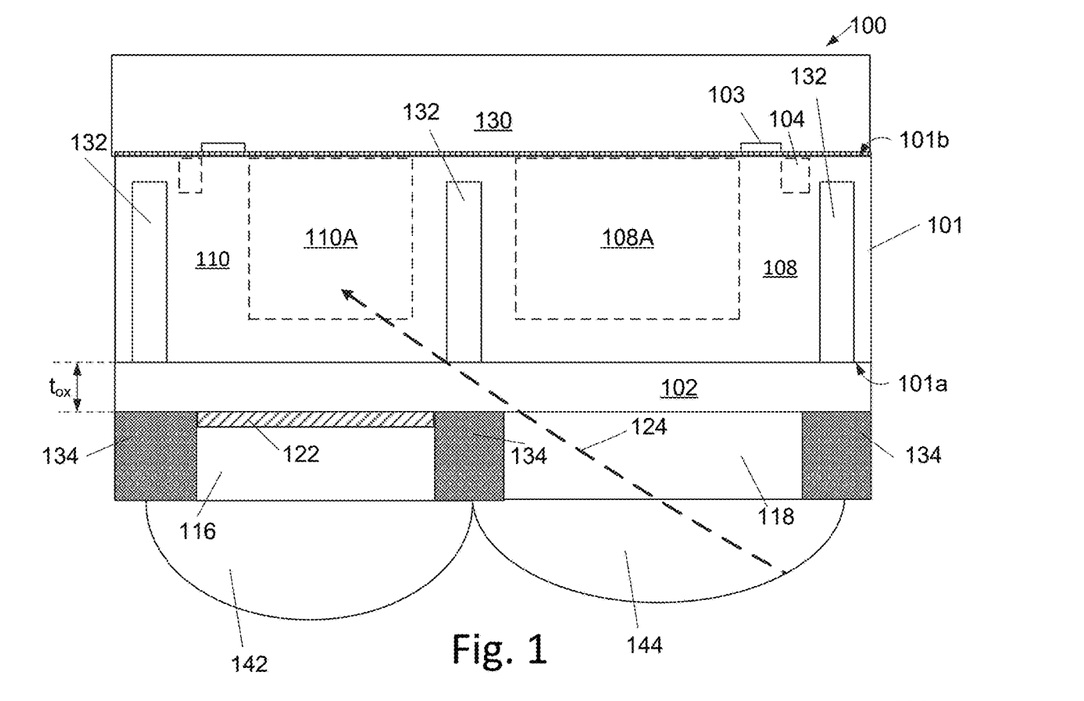
FIG. 1 is a cross section of a small portion of backside-illuminated image sensor, illustrating paths for light that may produce optical crosstalk between adjacent photodiodes of a photodiode array of the image sensor.

A backside-illuminated image sensors 100 (FIG. 1) includes a semiconductor substrate 101 having a plurality of photodiode regions 108A, 110A formed therein. The plurality of photodiode regions 108A, 110A may be arranged in an array form. Each of photodiode regions 110A is arranged to be adjacent to a photodiode region 108A. In some embodiments, photodiode regions 110 are surrounded by photodiode regions 108. Each photodiode region 108, 110, includes a photodiode 108A, 110A, along with associated pixel transistors. In an example for four-transistor configuration, pixel; transistors include a selection, a reset, a source-follower, and a row select transistors, of which only a selection transistor is shown in FIG. 1, as is common in the art of image sensor array.

In embodiments, backside 101a can be referred as an illuminated side of backside-illuminated image sensor 100, and front side 101b can be referred as a non-illuminated side of backside-illuminated image sensor 100. Photodiode 108A included in photodiode regions 108 may be referred as a large photodiode or low-light sensing photodiode for sensing low light portion of an image. Photodiode 110A included in photodiode regions 110 may referred as a small photodiode or bright-light sensing photodiode for sensing bright light portion of the image. In some embodiments, a full well capacity of each individual photodiode 110A is smaller than a full well capacity of each individual photodiode 108A. Full well capacity (FWC) may refer to a quantity of charges or electrons that a photodiode can accumulate before it reaches saturation. In other words, photodiode 108A may have larger charge storage capacity and able to store more photo-generated charges than photodiode 110A.

In embodiments, a photodiodes 108A and adjacent photodiode 110A form a high dynamic range (HDR) pixel in the backside-illuminated image sensor 100 to realize wide dynamic range imaging.

The selection transistor may also be referred to as a transfer transistor. In one embodiment, the selection transistor has a gate, such as transfer gate 103, that couples a photodiode, such as photodiode 108A, to a respective floating diffusion 104 and is configured to selectively transfer photo-generated charges from the photodiode, such as photodiode 108A, to the coupled floating diffusion 104 for image signal read out.

Admitted light induces photocurrent in the photodiodes 108A, 110A of the array of photodiodes. The photocurrent in individual photodiodes 110A, 108A of the array of photodiodes is sensed through the transistors formed on a front side 101b of semiconductor substrate 101. These transistors are controlled by a control circuitry, where control circuitry may be coupled to the pixel transistors through multi-layer metal interconnect structure. In operation, the photodiodes reset, select or transfer signals from the photodiodes, and output signals generated from photocurrents in the photodiodes under control of the control circuitry through a multi-layer metal interconnect structure (omitted for simplicity in the figures). The multi-layer interconnect structure is formed over an insulating oxide 130 formed on the front side 101b of semiconductor substrate 101. Additional insulating oxide layers and metal interconnect lines may be formed for signal routing.

In embodiments, the backside-illuminated image sensor 100 includes a metal grid 134 forming a plurality of apertures aligning with the plurality of photodiode regions 108, and 110. Each of color filters 116, 118 may be aligned to a respective photodiode region 108, 110, and disposed within a corresponding aperture of metal grid 134.

An optional light-attenuating, or neutral-density, filter 122 may be positioned in series of one or more color filters 116 associated with low-sensitivity photodiodes e.g., photodiode 110A in two-photodiode-per-pixel wide-dynamic-range image sensors to reduce intensity of incident light and lower the light sensitivity of bright light photodiode 110A. The photodiode 108A included in photodiode region 108 intended to respond primarily to dimly illuminated portions of an image, lack neutral density filters 122 and may have greater surface sensing area than photodiode 110A of photodiode regions 110. Restated, incident light directed to photodiode region 110, for example by a microlens 142 passes color filter 116 and neutral density filter 122 before entering photodiode regions 110 and absorbed by photodiode 110A. Incident light directed to photodiode region 108A, for example by microlens 144 passes respective color filter 118 before entering photodiode regions 108 and absorbed by photodiodes 108A.

In many image sensor devices, isolation structure 132 serve to isolate photodiodes 108A, 110A from each other and to eliminate electrical crosstalk such as would arise if carrier pairs generated in one photodiode region (e.g., photodiode region 108) were permitted to migrate to another photodiode region (e.g., photodiode region 110). Isolation structure 132 may be trenched structure in form of a trench grid surrounding each individual photodiode regions in the array of photodiode regions 108,110. In some embodiments, isolation structure 132 is oxide-filled isolation trench, or metal-filled isolation trench or a combination thereof. In embodiments, isolation structure 132 is aligned with metal grid 134 at least in a direction that is perpendicular to front side 101b surface of the semiconductor substrate 101.

The backside-illuminated image sensors 100 further includes a transparent buffer oxide layer 102 on the illuminated side of the image sensor 100 between metal grid 134 and a backside surface of the semiconductor substrate 101. The buffer oxide layer 102 is disposed to provide 1) isolation between metal grid 134 and semiconductor substrate 101, 2) a planarized surface for subsequent process (e.g., metal grid, color filter processing), and 3) protection to underlying material layers from stress-induced damage, such as stress induced from chemical mechanical polishing, affecting surface passivation and antireflection (not illustrated for simplicity) and substrate surface. In embodiments, buffer oxide layer 102 typically needs to have sufficient thickness at least about 130 nanometers to sustain processing-induced stress.

However, some light (e.g., light incident at high angle) directed to photodiode region 108 may enter along paths 124 which passes through color filters 118, penetrates buffer oxide layer 102 and reaching adjacent photodiode regions 110, causing an optical crosstalk. This optical crosstalk can obscure color differences, cause flare from brightly lit regions of an image into adjacent dimly lit regions of the image, obscure fluorescent emissions as they are drowned out by fluorescent stimulus light of adjacent photodiodes and interfere with bright-light photodiodes in two-photodiode-per-pixel wide-dynamic-range image sensors.

In image sensors having metal grid 134 disposed on buffer oxide layer 102 and between adjacent color filters 118, 116 to help reduce this optical crosstalk by reflection and/or absorption, some optical crosstalk persists because light can leak through buffer oxide layer 102.

Figure 2:
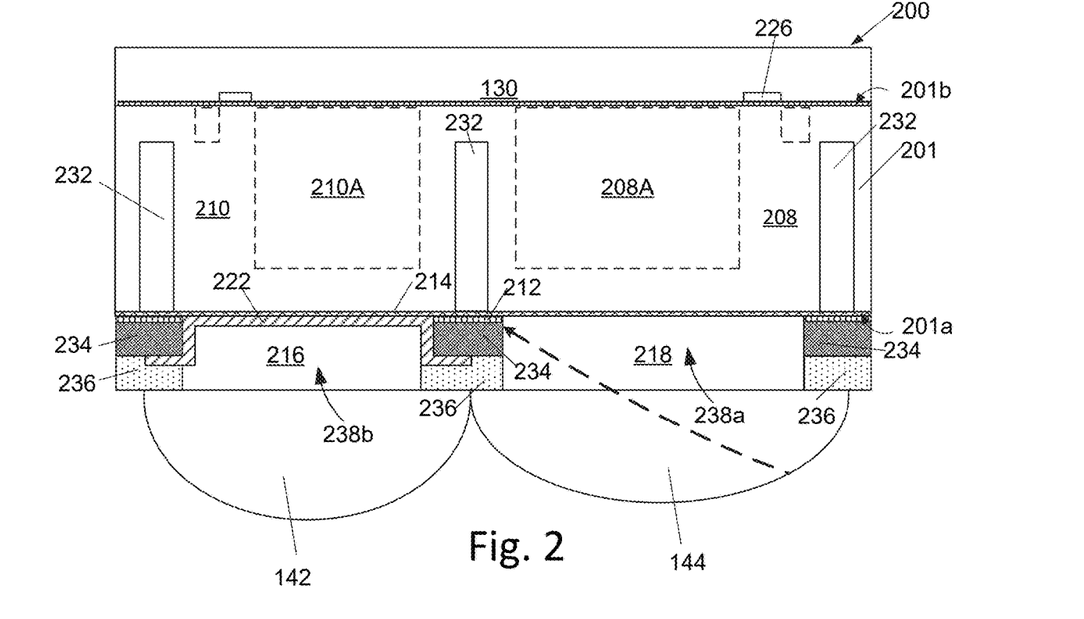
FIG. 2 is a cross section of an embodiment illustrating an image sensor with a metal grid provided between adjacent photodiodes to prevent optical crosstalk between photodiodes and spaced close to the backside of the image sensor in accordance with the teachings of the present disclosure.

A backside-illuminated image sensor 200 (FIG. 2), admits light through an array of color filters, such as color filter 116, 118 through a backside 201a of a semiconductor substrate 201 into an array of photodiode regions 208 and 210 formed in the semiconductor substrate 201. Shapes in FIG. 2 having reference numbers similar to reference numbers described above with reference to FIG. 1 have similar function to corresponding shapes in FIG. 1. Each of photodiode regions 208 and 210 includes a respective photodiode and associated selection, reset, source-follower, and row select transistors, of which only selection transistors (indicated by gate electrode 226) are shown in FIG. 2. Each photodiode region 210 is arranged adjacent to a photodiode region 208. Each photodiode region 208 includes a photodiode 208A, and each photodiode region 210 includes a photodiode 210A. While a planar selection transistor is illustrated in FIG. 2 alternative devices may have vertical selection transistors. In a particular embodiment, transfer gate 226 has at least one vertical electrode extended into semiconductor substrate 101.

In embodiments, photodiode regions 210 can be referred as bright-light photodiode sensing regions, and photodiode regions 208 is referred as dim or low light photodiode sensing regions. Photodiode region 210 may be arranged to be surrounded by photodiode regions 208. In embodiments, bright-light photodiode sensing regions 210 are intended to respond primarily to brightly illuminated portions of an image and may have neutral density filter 122 in addition to color filters 116, to reduce intensity of incident light directed to photodiode 210A; while dim or low light photodiode sensing regions 208 intended to respond primarily to dimly illuminated portions of an image and lack neutral density filters 122. Each of photodiodes 208A, may have greater full well capacity than each of photodiodes 210A to enhance sensitivity. In some examples, photodiode 208A may have a larger light exposure area than the light exposure area of neighboring small photodiode 210A.

In embodiments, each of photodiodes 208A is referred as large photodiode, and each of photodiodes 210A is referred as small photodiode. In some embodiments, a photodiode 210A and adjacent photodiode 208A form a HDR pixel.

In an embodiment of backside-illuminated image sensor 200 (FIG. 2), Applicants found that by stripping oxide layer 102 (FIG. 1) between metal grid 234 and backside 201a of semiconductor substrate 201 within active pixel regions containing photodiode regions 108, 110, while leaving oxide layer 102 present under peripheral region areas, of the image sensor 200 helps protect peripheral region areas from contamination. Stripping oxide layer 102 within active pixel regions can reduce or eliminates optical crosstalk between adjacent photodiode regions having optical paths penetrating through the oxide layer 102. In active pixel array region of photodiode regions 208, 210, the approximately 130 nanometer thick oxide layer is replaced with an etch-stop layer 212 of one to twenty nanometer thick. In embodiments, the etch-stop layer 212 includes a material having high etching selectivity over subsequent deposited material such as silicon oxide for peripheral region processing, metal material (e.g., tungsten or aluminum) for metal grid 234, and semiconductor substrate. In embodiments, the etch-stop layer 212 includes silicon nitride (SiN), silicon carbide (SiC), hafnium oxide ($HfO_2$), or a combination thereof. The image sensor 200 may further includes a dielectric layer 214 covering light sensing regions of photodiode regions 208, 210. The dielectric layer 214 is disposed beneath etch-stop layer 212 such that etch-stop layer 212 may serve as a protective dielectric layer and provide processing protection to underlying dielectric layer 214, for example during formation of metal grid 234. The dielectric layer 214 may comprise one or more material layers. In some embodiments, the dielectric layer 214 is a surface passivation layer comprising a material having a dielectric constant greater than 3.9 or a material with negative charges density. In some embodiments, the dielectric layer 214 is an anti-reflection layer that serves to increase transmission of at least one wavelength of interest into respective photodiode regions 208, 210.

In some embodiments, each of color filters 216 and 218 may be one of a red, blue, green, cyan, magenta, yellow, infrared, or panchromatic color filter for filtering corresponding wavelength. In some embodiments, the array of color filters 216, 218 is arranged accord to Bayer's pattern. In n single-photodiode-per-pixel, color filters 216 and 218 typically have differing passband, for example but not limitation color filter 216 may pass red light while blocking green light, and color filter 118 may pass green light but block red light. In two-photodiode-per-pixel, adjacent color filters 216, 218 may have a same wavelength passband e.g., both are red color filters, or both are blue color filters or both are green color filters. The backside-illuminated image sensor 200 typically admits light through an array of color filters, such as filter 216, 218, through a backside 201a surface of the semiconductor substrate 201 into an array of photodiode regions 208 and 210 formed in the semiconductor substrate 201.

The backside-illuminated image sensor 200 includes a metal grid 234 and a dielectric layer 236 disposed on the metal grid 234. Metal grid 234 and dielectric layer 236 collectively define a plurality of openings or apertures 238a, 238b, each aperture aligned with the plurality of photodiode regions 208, and 210. Each of color filters 216, 218 may be aligned to a respective photodiode region 208, 210, and disposed within a corresponding aperture 238a, 238b of metal grid 234. Metal grid 234 and dielectric layer 236 separates adjacent color filters 216, 218. The dielectric layer 236 may be formed of material such as silicon oxide having a refractive index lower than the color filters to induce internal reflection effect increasing light sensitivity of photodiode 208A, 210A.

A light attenuating or neutral-density filter 222 is disposed within aperture 238b aligning with photodiode region 210. A portion of attenuating or neutral-density filter 222 is disposed between metal grid 234 and dielectric layer 236. In embodiments, the etch-stop layer 212 has a plurality of openings aligning with photodiode regions 208, 210 i.e., no part of etch-stop layer 212 remains within apertures 238a, 238b. Restated, the etch-stop layer 212 has portions only between metal grid 234 and backside 201a surface as such etch-stop layer 212 does not affect the sensitivity of photodiodes 208A, 210A.

In image sensor 200 (FIG. 2), light that enters each of the color filters 218 and not absorbed in light attenuating or neutral-density filter 222 is directed into only a photodiode region 208 corresponding to the color filer 218. Light directed by microlens 142 passing through apertures 238b is first absorbed by light attenuating or neutral-density filter 222 and filtered by color filter 216 before reaching photodiode region 210, while light directed by microlens 144 passing through apertures 238b is filtered color filter 218 before reach photodiode region 208. In embodiments, the light-attenuating or neutral-density filter 222 has a portion positioned between metal grid 234 and dielectric material layer 236.

Isolation structure 232, an example of isolation structure 132, serves to isolate adjacent photodiodes 208A, 210A from each other and to eliminate electrical crosstalk that would arise if carrier pairs generated in one photodiode region 208 were permitted to migrate to another photodiode region 210 before being collected as photocurrent in photodiodes of the array of photodiodes. In embodiments, isolation structure 232 is a trenched isolation structure and form a trench-grid in the semiconductor substrate 201 surrounding each of photodiode regions 208, 210. In some embodiments, a depth of isolation structure 232 is the substantially the same as the thickness of semiconductor substrate 201. In some embodiments, a depth of isolation structure 232 is the less than the thickness of semiconductor substrate 201. In embodiments, a thickness of image sensor semiconductor substrate 201 ranges from 2.5 µm to 7 µm, and the depth that isolation structure 232 extend into semiconductor substrate 201 may range from 1 µm to 5 µm. In embodiments, isolation structure 232 may have one or more liner material layer lining trench surface. For example, the dielectric layer 214 may be part of liner material layer lining trench surface of isolation structure 232. Isolation structure 232 may be an oxide-filled isolation trench structure or a metal-filled isolation trench structure.

By removing buffer oxide layer 102, reducing the vertical gap distance between metal grid 234 and backside surface 201a of the semiconductor substrate 201, light directed to photodiode region 208 that is incident at high angle can be more effectively blocked by the metal grid 234 by absorption or reflection without straying to photodiode region 210 and absorbed by photodiode 210A; the crosstalk path 124 does not exist in embodiments of FIG. 2.

Figure 3:
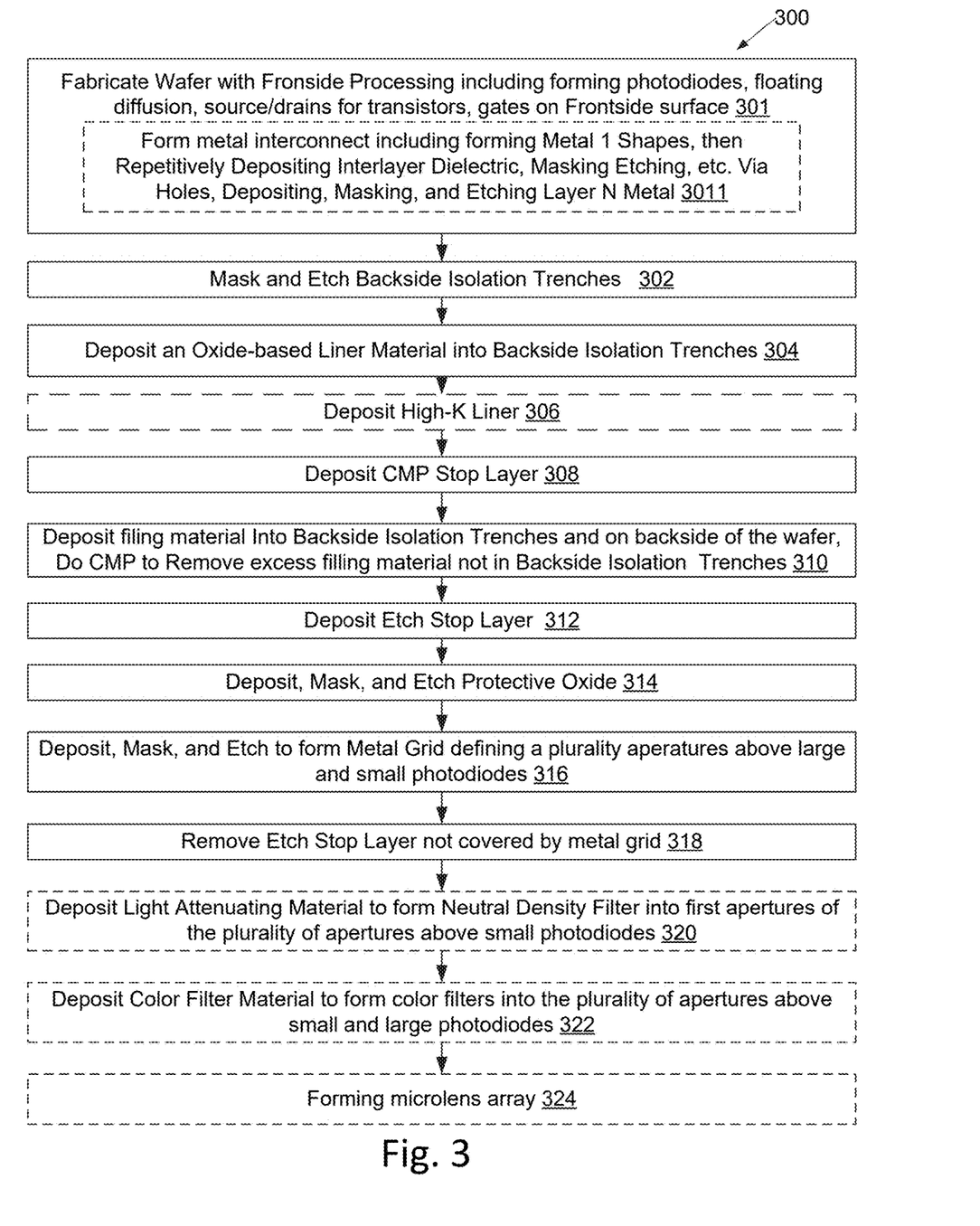
FIG. 3 is a flowchart illustrating a method of fabricating an image sensor in accordance with the teachings of the present disclosure.

The image sensor structure illustrated in FIG. 2 is formed according to a method 300 (FIG. 3) in view of FIGS. 4A-4J. Fabrication of backside structures of this image sensor begins after fabrication 301 of frontside structures on a wafer or a semiconductor substrate, including forming source-drain regions for transistors, ground contacts, transistor gates, floating diffusions, photodiodes that form a photodiode array in an image sensor. For example, an array of photodiodes 408, 410, 412, source-drain regions for transistors, and floating diffusions are formed in a semiconductor substrate 402 by masking and ion implantation with impurity of conductive type opposite to semiconductor substrate 402 (FIG. 4A) into front side 402b of semiconductor substrate 402. Photodiodes 408 and 412 are similar to photodiode 108A, 208A and photodiode 410 is similar to photodiode 110A, 210A. Photodiodes 408 and 412 each may have a full well capacity or a larger than photodiode 410. Photodiodes 408 and 412 may be referred as large photodiodes, and photodiode 410 may be referred as small photodiode. The semiconductor substrate 402 may comprise silicon, a silicon germanium alloy, germanium, a silicon carbide alloy, an indium gallium arsenide alloy, any other alloys formed of III-V compounds, other semiconductor materials or alloys, combinations thereof, and a bulk substrate thereof.

Figure 4A:
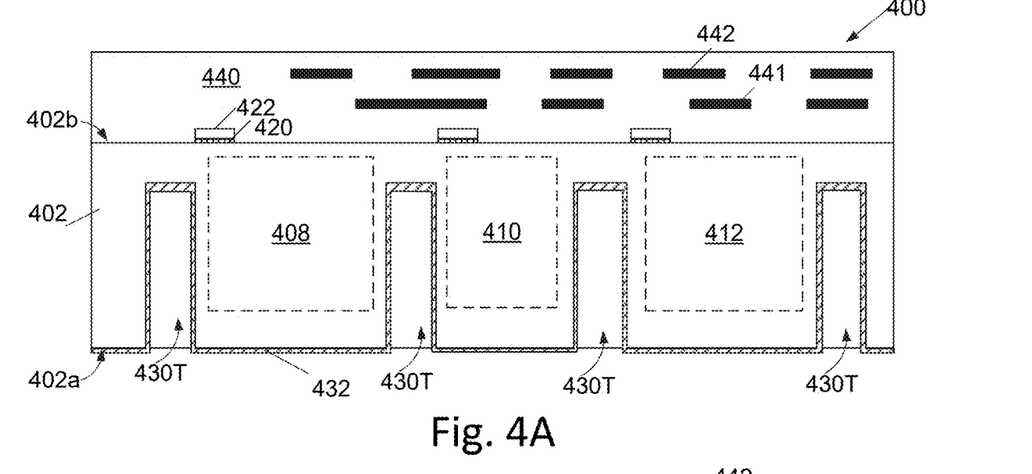
FIG. 4A-4J is a cross section of portions of an embodiment after frontside processing of an image sensor in accordance with the flowchart of FIG. 3.
Figure 4B:
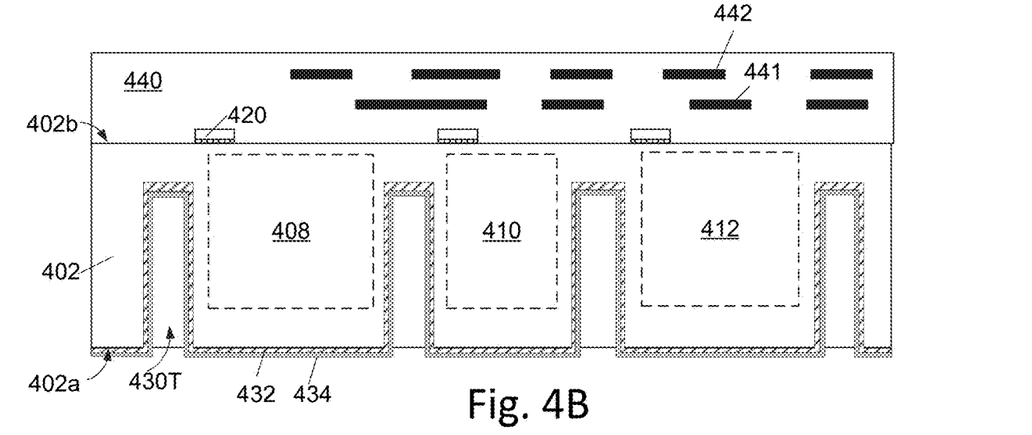

The semiconductor substrate 402 may further have gate insulation layer 420 formed on a front side 402b thereof by thermal oxidation process, and polysilicon gate material deposition and etching to form transistor gate electrodes 422 on gate insulation layer 420. Gates 420 are formed on front side 402b surface of semiconductor substrate 402. In embodiments, the semiconductor substrate 402 further has shallow isolation structures (not illustrated) extending from front side 402b into semiconductor substrate 402 providing additional isolation between photodiode regions and transistor regions. Further, fabrication 301 may further include deposition and etching of metal interconnect lines 3011, then repetitively executing a sequence of depositing interlayer dielectric, masking and etching via holes, and depositing, masking, and etching each successive metal interconnect layer to form of multi-layer metal interconnect structure. For example, a two-layer metal interconnect structure formed of a first-layer metal interconnect 441 and a second-layer metal interconnect 441 is embedded in an inter-metal dielectric layer 440 on front side 402b of semiconductor substrate 402. The inter-metal dielectric layer 440 may further encapsulate gate electrodes 422. Although two layers of metal interconnect are illustrated herein, it is appreciated that the number of layer metal interconnected is based on requirements for signal routing and may include more or fewer metal interconnect layers.

After completion of front-end processing, the wafer is flipped over to its backside and further back-end processing is done as illustrated in FIG. 4A. A plurality of backside isolation trenches are formed on the backside of the wafer by mask and etching process 302. In on example, each backside isolation trench is formed by removing corresponding portions of from backside of the semiconductor substrate through etching process and each backside isolation trench extends a depth from backside of the semiconductor substrate. For example, a plurality of backside isolation trenches 430T is formed on the backside 402a of the semiconductor substrate 402 between adjacent photodiodes 408, 410, 412. In embodiments, the plurality of backside isolation trenches 430T are interconnected forming a trench-grid surrounding each individual photodiode 408, 410, 412.

An oxide-based liner is deposited 304 into the plurality of backside isolation trenches and lines a surface of the respective backside isolation trench. As illustrated in FIG. 4A, the backside isolation trenches 430T and backside 402a surface of semiconductor substrate 402 are lined with this deposited dielectric oxide 432. The dielectric oxide 432 is a relative thin layer of thickness less than or equal to fifteen nanometers.

After lining the backside isolation trenches with oxide-based liner (first liner layer), in some embodiments a second liner layer (FIG. 4B) of a high dielectric constant (high K) material is deposited 306 into the plurality of backside isolation trenches on the oxide-based liner and is further extended onto the backside surface of the wafer. A second liner layer 434 of high k material is deposited into the plurality of backside isolation trenches 430T on the dielectric oxide 432. The second liner layer 434 is further deposited onto backside 402a surface of semiconductor substrate 402 covering light sensing regions of photodiodes 408, 410, 412. The second liner layer 434 may be a continuous layer that lines the backside isolation trenches 430T and backside 402a surface of semiconductor substrate 402. The second liner layer 434 may include one or more high k material layers. The dielectric oxide 432 (first liner layer) may serve as an adhesive layer attaching the second liner layer 434 onto trench surfaces of each respective backside isolation trench 430T. In embodiments, the second liner layer 434 is a material selected from aluminum oxide ($Al_2O_3$), hafnium oxide ($HfO_2$), tantalum oxide (TaO), or a combination thereof.

Figure 4C:
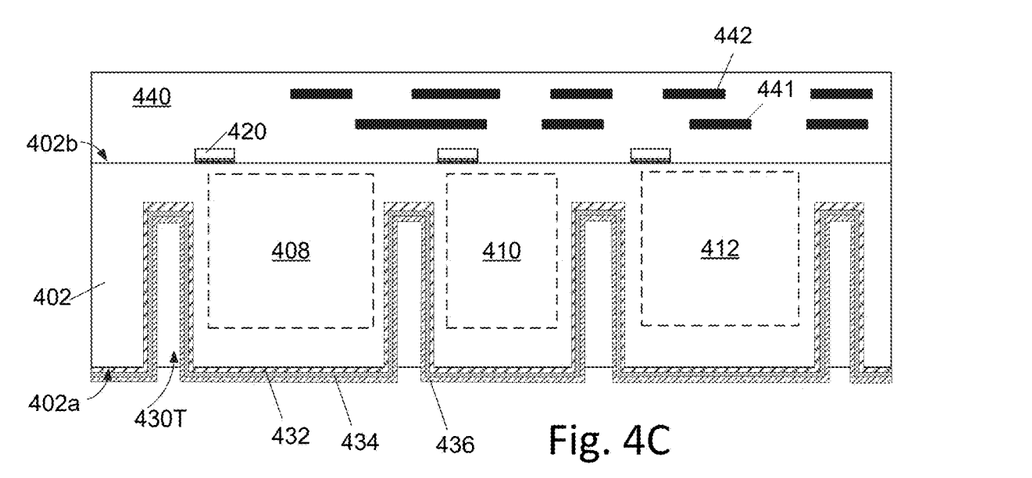
Figure 4D:
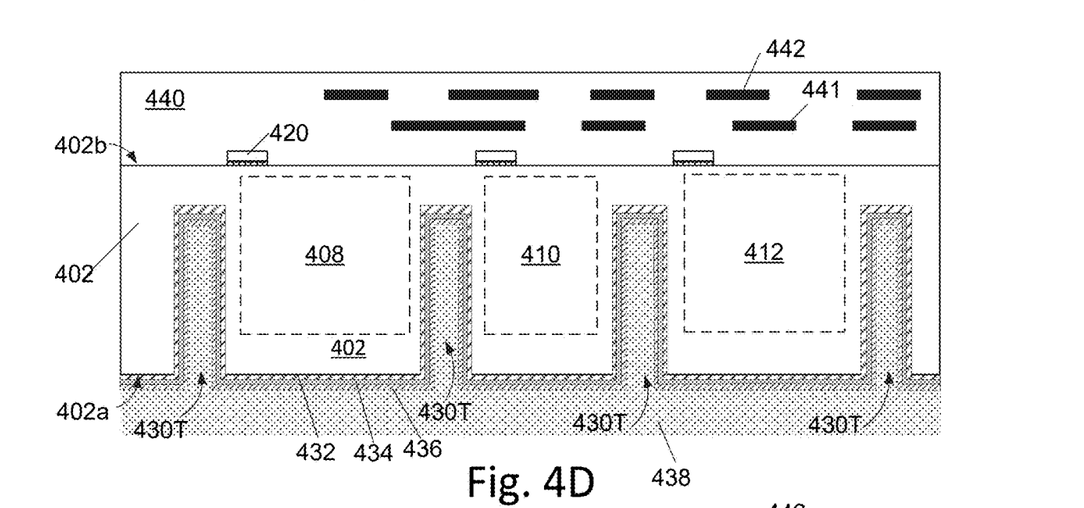

A chemical-mechanical polish (CMP) stop layer configured to stop CMP processes such as are often used to planarize integrated circuit substrate surfaces is then deposited 308 into the plurality of backside isolation trenches and on backside surface of the wafer over the second liner. (FIG. 4C). A CMP stop layer 436 is deposited over the second liner 434. The CMP stop layer 436 may be of one to twenty nanometers thick. In an alternative embodiment the CMP stop layer 436 may be deposited first after oxide-based liner deposition (e.g., dielectric oxide 432) and topped with the second liner layer 434.

Figure 4E:
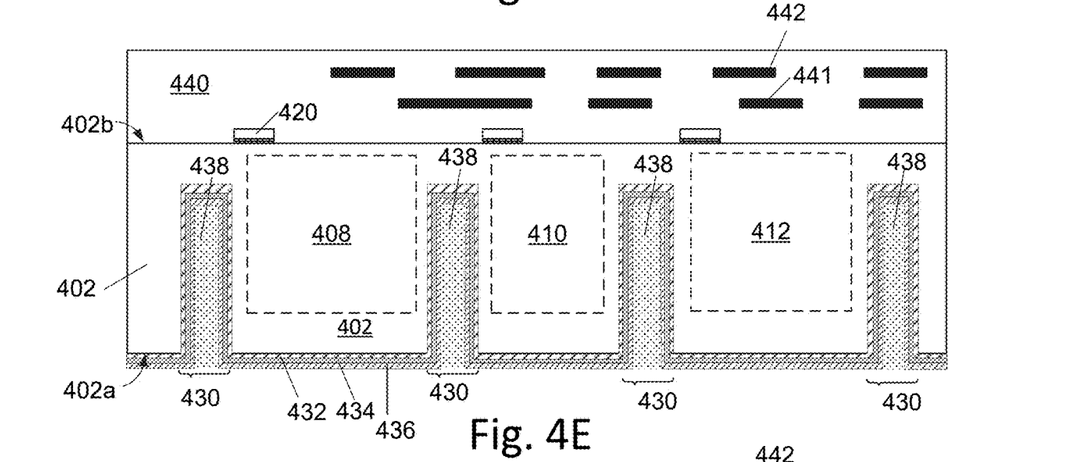

Once the CMP stop layer 436 and second liner layer 434 are in place, a dielectric filling material, such as silicon dioxide is deposited 310, for example by chemical vapor deposition into the plurality of backside isolation trenches and on backside surface of the wafer over the CMP stop layer and the second liner layer, (FIG. 4D), and a CMP process is performed subsequently to remove the excess dielectric filling material e.g., from areas of the backside of the wafer outside the backside isolation trenches, including from over the photodiodes. (FIG. 4E). During the CMP process of removing excess dielectric filing material, CMP stop layer 436 may function as a layer material for end-point detection CMP process. Dielectric filling material 438, such as silicon oxide or a low n dielectric material (e.g., dielectric material having refractive index lower than the semiconductor substrate 402) is deposited into the plurality of backside isolation trenches 430T over the CMP stop layer 436 and the second liner layer 434 filling backside isolation trenches 430T and on the backside 402a surface of semiconductor substrate 402 over the photodiodes 408, 410, 412. In some embodiments, the CMP stop layer 436 is a layer formed of material that is different from dielectric filling material. For example, the CMP stop layer 436 may be formed of a material having high selectivity over dielectric filling material 438 and semiconductor substrate 402 allowing the selective removal of excess dielectric filling material 438, e.g., the CMP stop layer 436 may have a polishing rate lower than the dielectric filling material. The material for CMP stop layer 436 may include silicon nitride (SiN), silicon carbide (SiC), or hafnium oxide ($HfO_2$).

For example, a CMP process is performed subsequently on the backside 402a surface of semiconductor substrate 402, the CMP process removes dielectric filling material 438 from areas of the backside 402a of the semiconductor substrate 402 that are outside the backside isolation trenches 430T, leaving the dielectric filling material 438 only in the plurality of backside isolation trenches 430T forming backside isolation structures 430 providing electrical and optical isolation between adjacent photodiodes 408, 410, 412.

In some embodiments, the dielectric filling material has a top surface levelled with a top surface of the CMP stop layer 436 or the second liner layer 434 depending on the order of deposition. For example, when CMP stop layer 436 is deposited after the deposition of the second liner layer 434, the top surface of dielectric filling material 438 is levelled with the CMP stop layer 436. For example, when CMP stop layer 436 is deposited prior to the deposition of the second liner layer 434, the top surface of dielectric filling material 438 is levelled with the second liner layer 434. When the second liner layer 434 is formed of multi-layer stack, the top surface of dielectric filling material 438 is levelled with the topmost layer of the second liner layer 434. In other words, the top surface of dielectric filling material 438 is levelled with layer material that is immediate adjacent thereto in the backside isolation trench 430T. In some embodiments, the top surface is slightly lower than the top surface of the CMP stop layer 436 or the second liner layer 434 after CMP process.

Figure 4F:
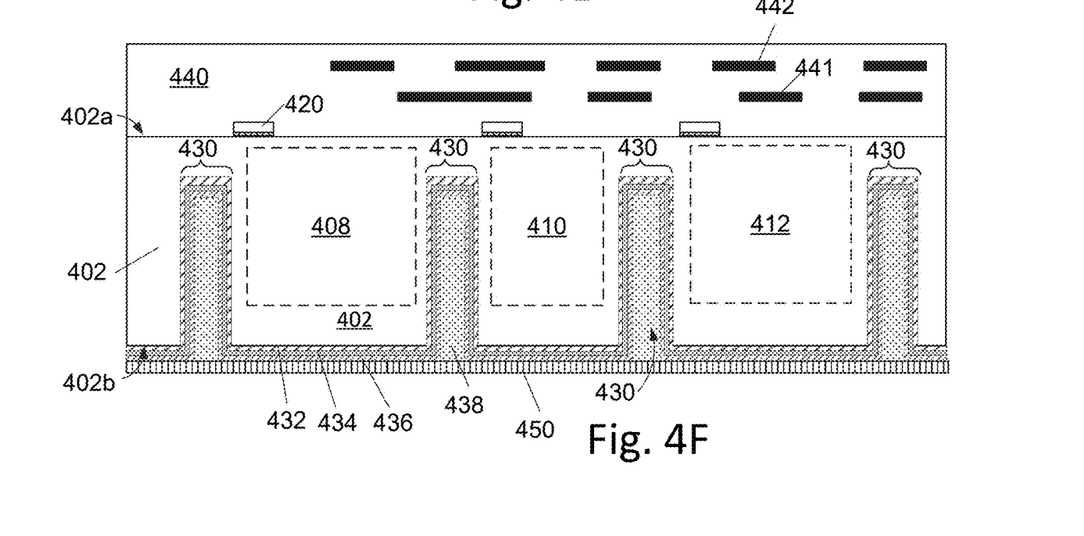

In deposition step 312, an etch-stop layer is deposited over the backside of the wafer covering the dielectric-filling backside isolation structure and photodiodes (FIG. 4F). An etch stop layer 450 is deposited on the backside 402a of semiconductor substrate 402 covering the plurality of backside isolation structures 430 and photodiodes 408, 410, 412 in the active pixel region. The etch stop layer 450 may be formed of material having high etch selectivity over dielectric filling material 438 and the semiconductor substrate 402. In embodiments, the etch stop layer 450 is a layer of a dielectric material. The etch stop layer 450 may be formed of silicon nitride (SiN), silicon carbide (SiC), or hafnium oxide (HfO$_2$). The etch stop layer 450 further cover areas in the active pixel region allowing additional process for peripheral region such as insulation layer deposition and contact pad formation. In embodiments, the etch stop layer 450 has a thickness ranging from one to twenty nanometers.

In embodiments, the semiconductor substrate 402 includes an active pixel region 405A and a peripheral region 405P, where the peripheral region 405 surrounds active pixel region 405A. In some embodiments, the peripheral region 405 is arranged adjacent to pixel region 405A. In some embodiments, there are one or more intermediate regions such as dummy pixel region or an optical black pixel region in between the peripheral region 405 and pixel region 405A. In embodiments, the etch stop layer 450 is deposited within the active pixel region 405A and does not extend over into the peripheral region 405P. The etch stop layer 450 provides protection to active pixel region 405A by allowing process separation of backside contact structures 470 in peripheral region 405P from active pixel region 405A.

For example, after the etch stop layer 450 is deposited in an active pixel region 405A, a plurality of backside contact structures 470 is formed on backside 420a of the semiconductor substrate 402 within peripheral region 405P.

Each of backside contact structures 470 may be extended from backside 420a toward front side 402b and contacting a corresponding metal interconnect 445 in the multilayer interconnections structure for signal connection. Each of the backside contact structures 470 is electrically isolated from semiconductor substrate 402 by an insulation layer 472 (e.g., silicon oxide).

In one embodiment, the process for forming the plurality of backside contact structures 470 includes blankly depositing dielectric material (e.g., silicon oxide) on the etch stop layer 450 in active pixel region 405A and on the semiconductor substrate 402 in peripheral region 405P, masking and etching a plurality of trenches or openings through deposited dielectric material and semiconductor substrate 402, depositing insulation liner material into the plurality of contact trenches forming the insulation layer 472, depositing the conductive material into the plurality of contact trenches to form backside contact structures 470, and forming a hard mask layer covering the backside contact structures 470.

Figure 4G:
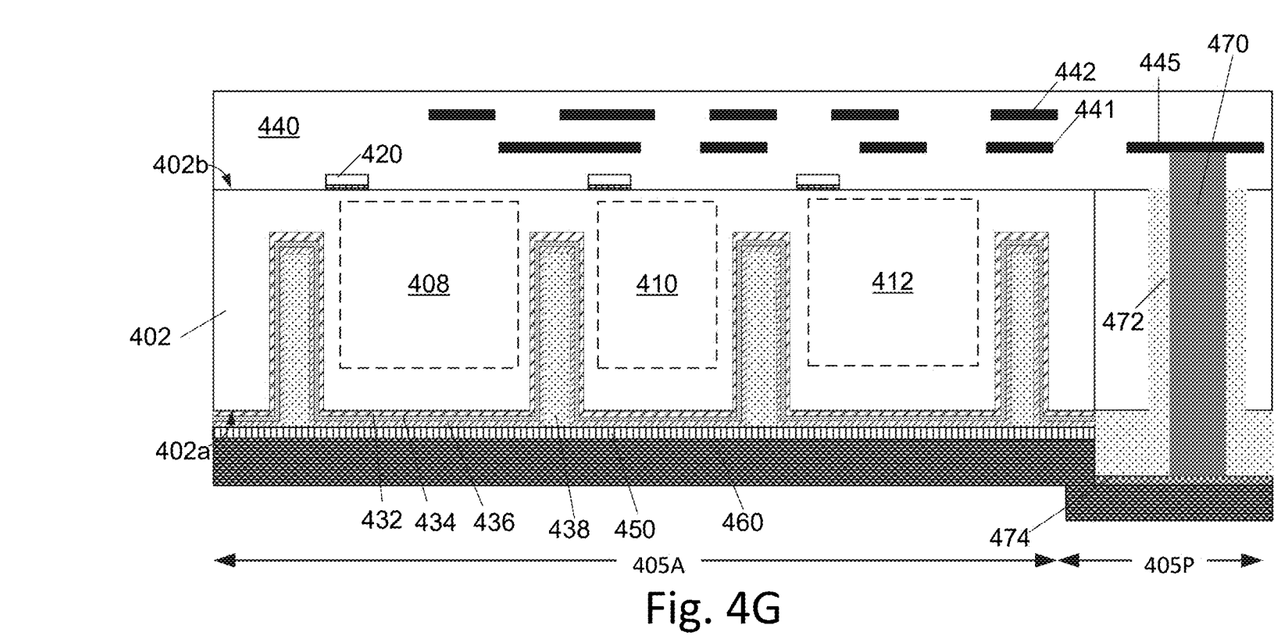

An additional protective oxide layer is deposited 314 over the backside of the wafer, followed by masking and etching to form a protective layer surrounding backside contact structures (FIG. 4G). A protective oxide layer 473 is deposited and formed over the backside 402a of semiconductor substrate 402. The protective oxide layer 473 and insulation layer 472 may be formed of the same material. The protective oxide layer 473 and the backside contact structures 470 are topped with a hard mask layer 474, such as silicon nitride hard mask, follow by another etching process to remove portions of silicon nitride hard mask 474 and protective oxide layer 473 overactive pixel regions 405A, remaining as a protective oxide over peripheral region 405P surrounding backside contact structures 470. This etch process of removing portions of protective oxide layer 473 in active pixel region 405A stops at the etch stop layer 450, so the etch does not erode into the material layer deposited on in active pixel region 405A and backside isolation structure 430. The hard mask layer 474 further protects backside contact structures 470 from subsequent process in active pixel regions 405A.

Figure 4H:
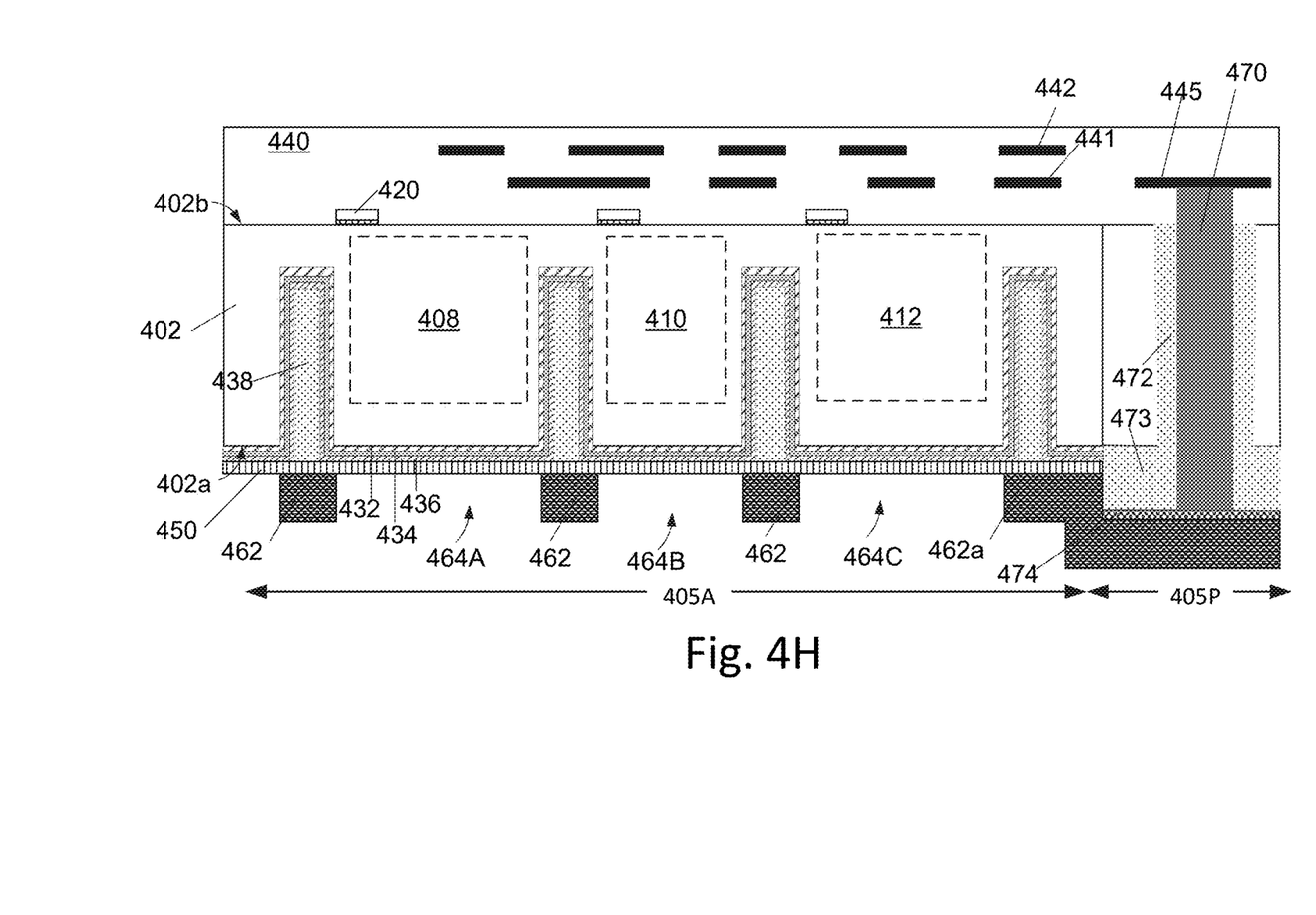
Figure 4I:
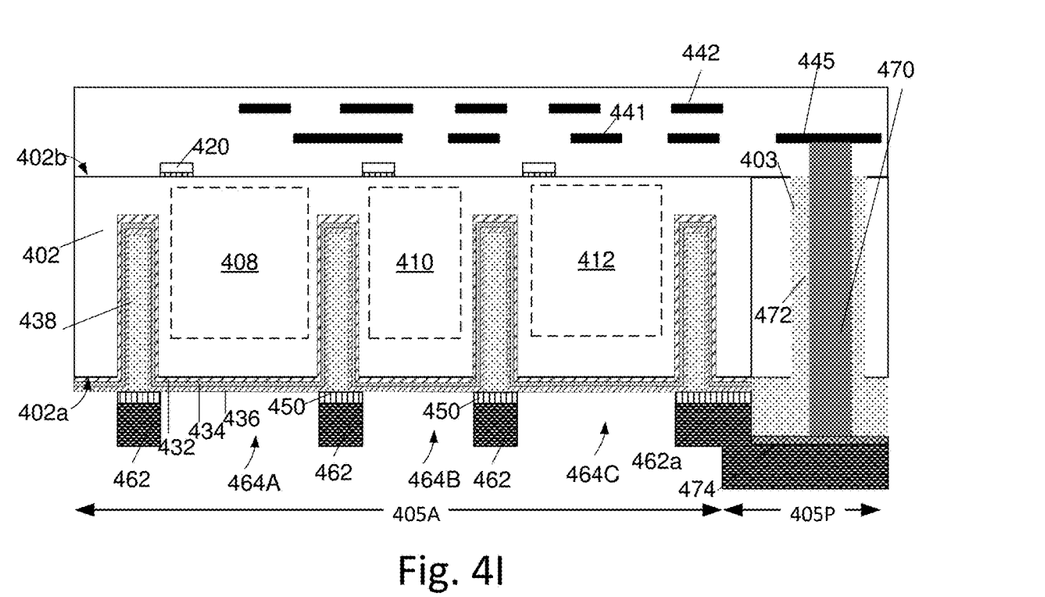

Next, metal material is deposited 316 on backside of the wafer over the etch-stop layer and hard mask layer coated on backside contact structures, patterned and etched to form the metal grid (FIG. 4G-4H). Metal material 460 is first blankly deposited on the backside 402a of the semiconductor substrate 402 over active pixel region 405A and peripheral region 405P. Thereafter, metal material 460 is patterned and etched to form a metal grid 462 on the etch-stop layer 450 over backside isolations structures 430. Metal grid 462 defines a plurality of apertures 464A, 464B, 464C, aligning with light sensing regions of photodiodes 408, 410, 412. For example, aperture 464A aligns with a light sensing region of photodiode 408, aperture 464B aligns with a light sensing region of photodiode 410, and aperture 464C aligns with a light sensing region of photodiode 412. The metal grid 462 further aligns with the backside isolations structures 430. In particular embodiments, the metal material 460 comprises aluminum (Al) or tungsten (W). The metal grid 462 further has a portion 462a extends from active pixel region 405A into peripheral region 405P on the hard mask layer 474. The hard mask layer 474 may have a top surface that is levelled with a top surface of metal grid 462 that resides in active pixel region 405A.

Once the metal grid is masked and etched, the etch stop layer may be removed 318 from over photodiode regions in active pixel region to avoid color disturbance or light sensitivity reduction due to light absorption in the etch stop layer. (FIG. 4I) After the formation of metal grid 462, portions of etch stop layer 450 formed over photodiodes 408, 410, 412 are removed, for example by another etching process. In other words, portions of etch stop layer 450 within the plurality of apertures 464A, 464B, 464C are removed while portions of etch stop layer 450 between metal grid 462 and backside 402a surface of the semiconductor substrate 402 remain such that the sensitivity of photodiodes 408, 410, 412 will not be affected. In some embodiments, the shape of openings on etch stop layer 450 may have shape following the apertures 464A, 464B, 464C. In an embodiment, etch stop layer 450 is immediately between the metal grid 462 and the dielectric filling structure 438.

Figure 4J:
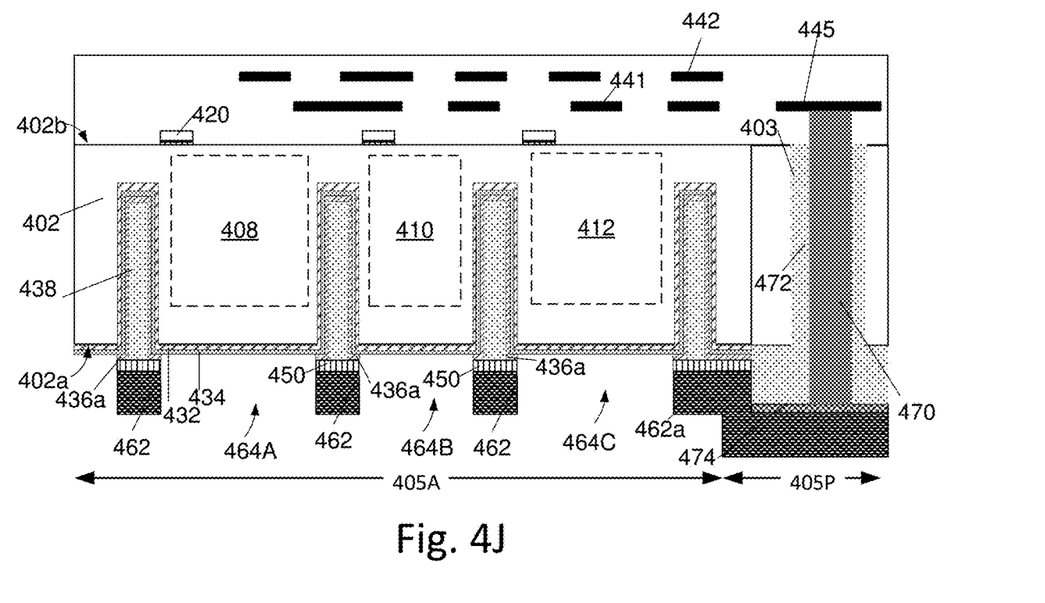

In one embodiment, after removal of the etch stop layer, the CMP stop layer may be further removed. (FIG. 4J). Portions of CMP stop layer 436 formed over photodiodes 408, 410, 412 are removed, for example by another etching process. In other words, portions of CMP stop layer 436 within the plurality of apertures 464A, 464B, 464C are removed while small portions of CMP stop layer 436a between metal grid 462 and backside 402a surface of the semiconductor substrate 402 and within backside isolation trench 430T remain such that sensitivity of photodiodes 408, 410, 412 will not be affected.

Figure 5:
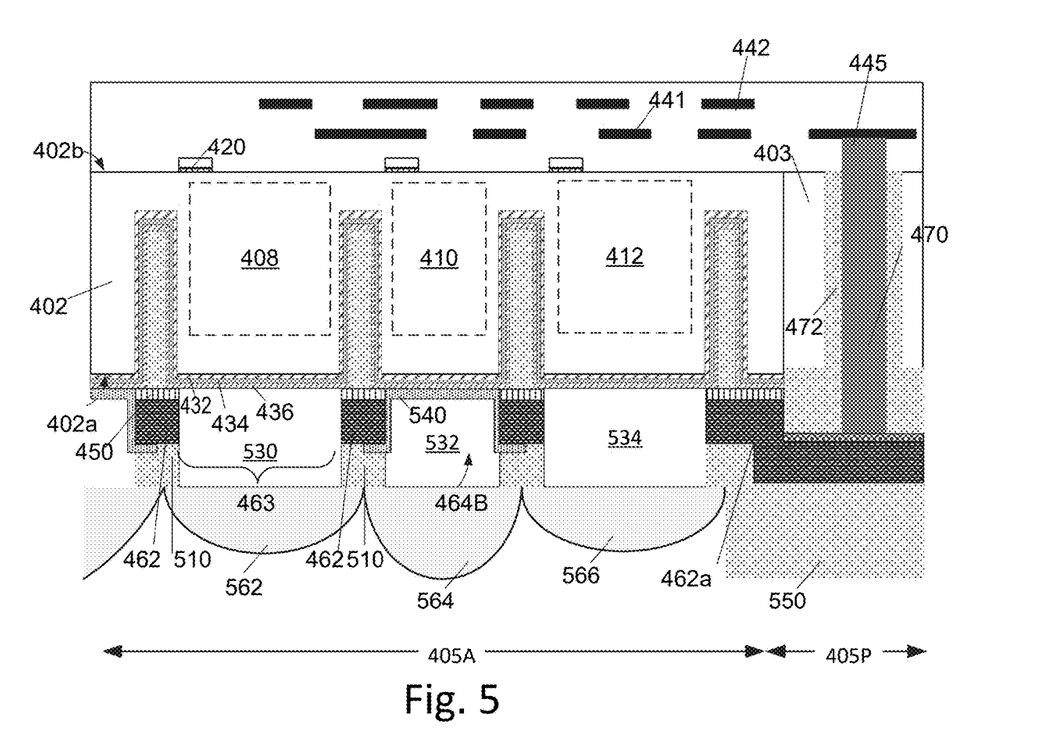
FIG. 5 is a cross section of an embodiment after further processing including depositing light attenuating or neutral density filters, color filters, and microlenses.

Neutral density filter is deposited 320 in the metal grid defined apertures (e.g., aperture 464B) that are aligned over the light sensing area of small photodiodes. (FIG. 5)

Light absorbing or neutral-density filters 540 are deposited in apertures, such as aperture 464B, aligned with light sensing area of photodiode 410 (small photodiode) to reduce light sensitivity of photodiode 410. Color filters are subsequently deposited, masked and formed 322 in the plurality of metal grid defined apertures. Color filters 530, 532, 534 are deposited into plurality of apertures 464A, 464B, and 464C. Color filters 530 and 534 are respectively deposited into apertures 464A and 464C on the CMP stop layer 436 or second liner layer 436. Color filter 532 is deposited into aperture 464B on the light absorbing or neutral-density filter 540. Thereafter, additional low n material layer 510 such as silicon oxide may be deposited onto metal grid 462 between color filters 530, 532, 534, such that metal grid 462 and low n material layer 510 separates adjacent color filters 530, 532, 534. In embodiments, the light absorbing or neutral-density filter 540 has a portion in between metal grid 462 and low n material layer 510.

Afterwards, microlens material (e.g., polymer) is deposited 324 and molded to form an array of microlenses. For example, array of microlenses 562, 564, 566 is formed on color filters 530, 532, 534 and metal grid 462 aligning with respective photodiodes 408, 410, 412 for directing incident light to respective photodiode 408, 410, 412.

In some embodiments, CMP stop layer 436, and etch stop layer 450 are each between one and 20 nanometers thick, the second liner 434 may have thickness between 20 to 40 nanometers, a distance between the metal grid 462 and backside 402a surface is about sixty to eighty nanometers compared to 130 nanometers of buffer oxide layer 102, thus crosstalk from adjacent photodiodes (e.g., from photodiode 415 to photodiode 410) due to incident light at high angle can be effectively reduced.

Although the small photodiode 608 or large photodiode 606 illustrated are of octagonal shape, it should be appreciated the shape of large photodiode 606 and small photodiode 608 can be another suitable polygonal shape such as square, rectangular, or triangular based on pixel layout needs. The shape of metal grid 640 and its defined apertures 642a, 642b (e.g., cross-section shaped of metal grid 640 along a plane in parallel to substrate surface) may also have shape conformal to the shape the shape of the large and small photodiodes 606, 608. (FIG. 6) The openings on the underneath etch stop layer (e.g., etch stop layer 450) may have shape following the apertures 642a, 642b of the metal grid 640. The metal grid 640 may be arranged to align with isolation structure. In an exemplary layout (FIG. 6) the metal grid 640 surround each individual photodiodes 606, 608 in a pixel array of an image sensor. Each of aperture 642a aligns with light sensing or exposure area of photodiodes 606 and each of aperture 642n aligns with light sensing or exposure area of photodiodes 608.

Figure 6:
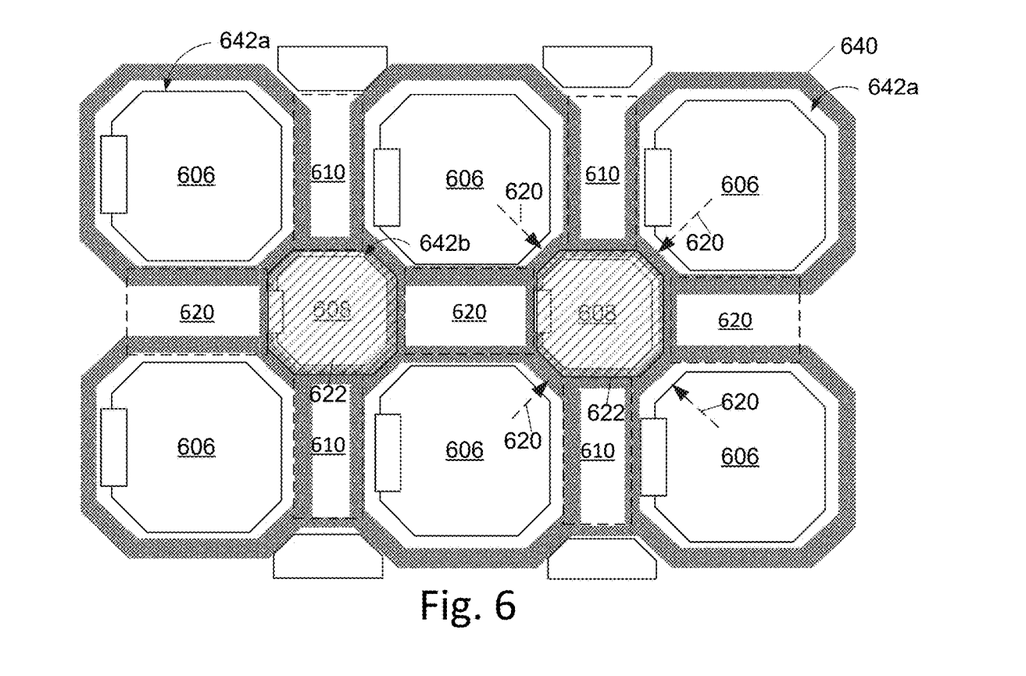
FIG. 6 is a top plan view of an image sensor in accordance with the teachings of the present disclosure.

As shown in FIG. 6 (a plan viewed of a backside of an embodiment), a small photodiode 608 may be surrounded by four large photodiodes 606. Transistor region 610 is disposed between adjacent large photodiodes 606 and may include one or more pixel transistors associated with large photodiode 606. Transistor region 610 disposed between adjacent small photodiodes 608 may include one or more pixel transistors associated with small photodiode 608. Metal grid 640 is arranged in between adjacent photodiodes to reduce crosstalk (e.g. light path 620) through absorption and/or reflection. Metal grid 640 defines a plurality of apertures 463 aligned with light sensing area of photodiodes 606, 608. In embodiments, each of small photodiodes 608 has a first full well capacity smaller than a second full well capacity of each of adjacent large photodiodes 606 and stores less photo-generated charges than each individual large photodiode 606. Alternatively, each of large photodiodes 606 may have larger light exposure area than the light exposure area of each neighboring small photodiode 608. In embodiments, a neutral-density filter 622, similar to neutral-density filter 222 is disposed on metal grid 640 and in the apertures 642b covering light sensing region of small photodiodes 608 to attenuate light directed to small photodiodes 608.

Figure 7:
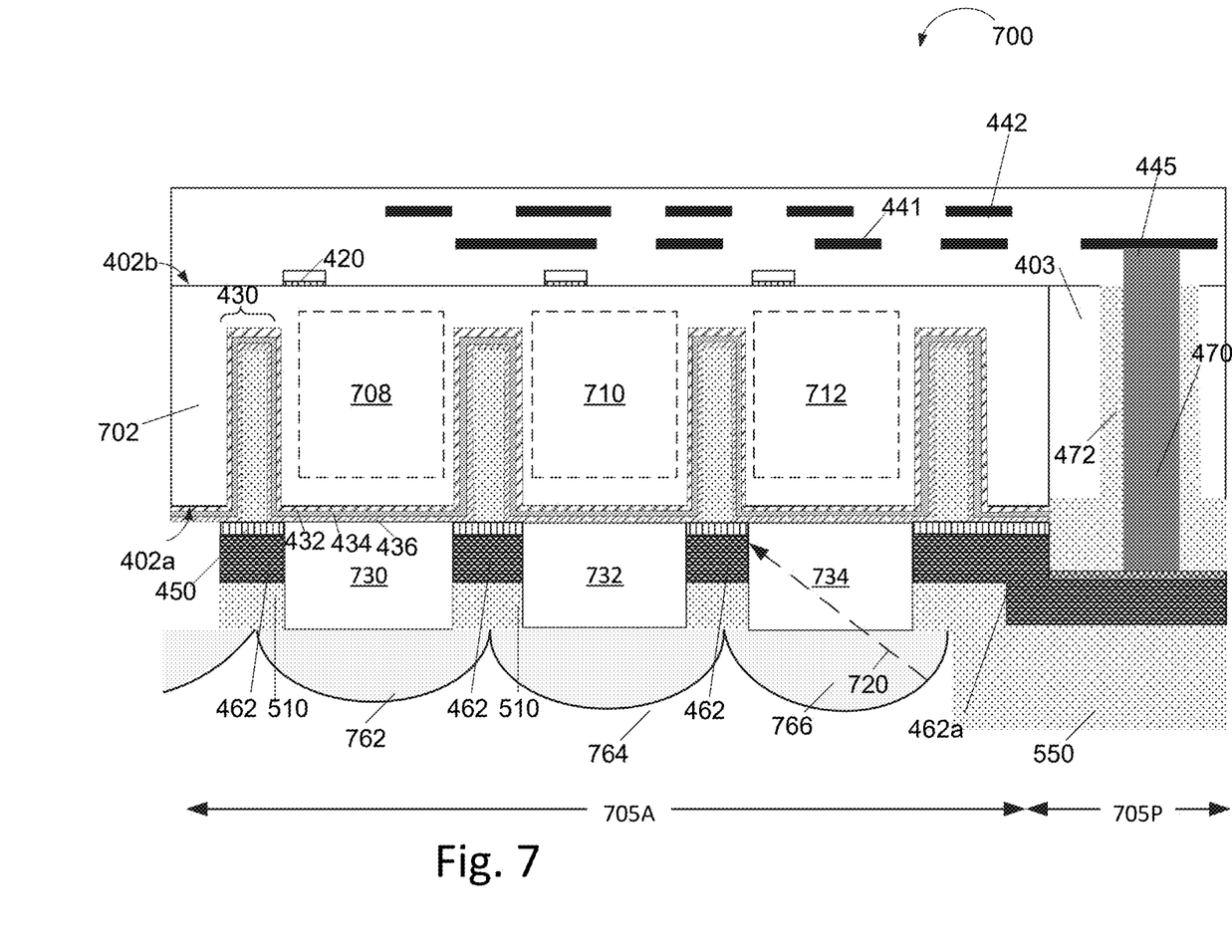
FIG. 7 is cross section of another embodiment illustrating an image sensor in accordance with the teachings of the present disclosure.

Although the above-described backside structure including metal grid and etch stop layer reduces crosstalk between small photodiode and adjacent large photodiode in a pixel array comprising of a plurality of large and small photodiodes for a backside-illuminated image sensor, it should be appreciated that the described backside structure can be applied to reduce crosstalk between adjacent photodiodes having the same full well capacity as illustrated in FIG. 7. A backside-illuminated image sensor 700 includes features similar to the backside-illuminated image sensor of FIG. 5 except where noted below, and accordingly like numbered-elements have like function. The backside-illuminated image sensor 700 includes a pixel array formed in an active pixel region 705 of a semiconductor substrate 702, wherein active pixel region 705A is adjacent to a peripheral region 705P. Peripheral region 705P is an example of peripheral region 405P in FIG. 5 and includes at least a backside contact structure for forming external signal connection (e.g., with integrated circuitry on a logic wafer or with an external circuitry). The pixel array includes a plurality of photodiodes 708, 710, and 712, where the plurality of photodiodes 708, 710, 712 are of the same full well capacity and have same sensitivity to incident light. There is no neutral density filter disposed between respect color filters 730, 732, 734 and backside surface 402a of semiconductor substrate 702. Light directed to photodiodes 708, 710, 712 by corresponding microlenses 762, 764, 766 pass through corresponding color filters 730, 732, 734 without being attenuated, accordingly each of photodiodes 708, 710, and 712 have similar sensitivity to incident light.

By thinning material thickness, shortening the gap between metal grid 462 and the corresponding backside isolation structures 430 in the semiconductor substrate 702, light (e.g., light 720) directed to a photodiode (e.g., photodiode 712) that is incident at high angle can be effectively blocked by the metal grid 462 by absorption or reflection without crossing over to adjacent photodiode (e.g., photodiode 710).

Combinations and Features

The features herein disclosed can be combined in many ways. Among feature combinations anticipated by the inventors are:

A backside-illuminated image sensor designated A includes a semiconductor substrate; a plurality of photodiodes arranged in an array form formed in the semiconductor substrate; a first dielectric layer disposed on a backside of the semiconductor substrate, the first dielectric layer having a plurality of openings aligning with each of the plurality of photodiodes; and a metal grid disposed on the first dielectric layer, the metal grid defining a plurality of apertures aligning with the plurality of photodiodes.

A backside-illuminated image sensor designated AA includes the backside-illuminated image sensor designated A, a distance between the metal grid and a backside surface of the semiconductor substrate being greater than zero but less than eighty nanometers.

A backside-illuminated image sensor designated AB includes the backside-illuminated image sensor designated A or AA, the plurality of photodiodes being electrically isolated from each other by a plurality of isolation structures, and the metal grid being aligned with the plurality of isolation structures.

A backside-illuminated image sensor designated AC includes the backside-illuminated image sensor designated A, AA, or AB, wherein each of the plurality of isolation structures includes a trench formed in the semiconductor substrate; an oxide-based liner disposed in the trench, the oxide-based liner lining surfaces of the trench; a high k material layer disposed in the trench on the oxide-based liner and on the backside of the semiconductor substrate; a second dielectric layer disposed in the trench on the high k material layer; and a filling material deposited in the trench, the filling material surrounded by the second dielectric layer. The filling material may partly fill the trench. In this embodiment, a high k material layer and the second dielectric layer are arranged to be extended onto the backside of the semiconductor substrate and underneath the first dielectric layer such that the first dielectric layer may provide process protection to the high k material layer and the second dielectric layer.

A backside-illuminated image sensor designated AD includes the backside-illuminated image sensor designated A, AA, AB, or AC, the first dielectric layer being disposed between the metal grid and the filling material of each trench.

A backside-illuminated image sensor designated AE includes the backside-illuminated image sensor designated AC or AD, the high k material layer comprising aluminum oxide or tantalum oxide or a combination thereof.

A backside-illuminated image sensor designated AF includes the backside-illuminated image sensor designated A, AA, AB, AC, AD, or AE, wherein the first dielectric layer has a thickness ranged between one nanometer to twenty nanometers.

A backside-illuminated image sensor designated AG includes the backside-illuminated image sensor designated A, AF, AA, AB, AC, AD, or AE, the first dielectric layer being an etch-stop layer and comprising a material having an etching selectivity over the metal grid.

A backside-illuminated image sensor designated AH includes the backside-illuminated image sensor designated A, AF, AG, AA, AB, AC, AD, or AE, the first dielectric layer comprising at least one of silicon nitride, silicon carbide or hafnium oxide.

A backside-illuminated image sensor designated AJ includes the backside-illuminated image sensor designated A, AF, AG, AH, AA, AB, AC, AD, or AE, wherein the plurality of openings includes a first group of openings that are aligned with a first group of photodiodes, and a second group of openings aligning with a second group of photodiodes, wherein each photodiode in the first group of photodiodes has a first full well capacity less than a second full well capacity of each photodiode in the second group of photodiodes.

A backside-illuminated image sensor designated AK includes the backside-illuminated image sensor designated A, AA, AB, AC, AD, AE, AF, AG, AH, or AK, further including a plurality of neutral-density filters in the first group of openings and wherein the second group of openings lacks neutral-density filters; and a plurality of color filters in the first group of openings and in the second group of openings, wherein the metal grid separates adjacent color filters.

An image sensor designated B, includes a first photodiode disposed in a semiconductor substrate; an isolation structure disposed in the semiconductor substrate between the first photodiode and adjacent devices, the isolation structure extending from a backside of the semiconductor substrate into the semiconductor substrate and electrically isolating the first photodiode and the second photodiode. The image sensor also includes a metal grid disposed on the backside of the semiconductor substrate, the metal grid defining a first aperture aligning with the first photodiode and a second aperture aligning with the second photodiode, the metal grid being vertically aligned with the isolation structure; and a first dielectric layer disposed on the backside of the semiconductor substrate and between the metal grid and isolation structure, wherein the first dielectric layer has a first opening aligning with the first aperture and a second opening aligning with the second aperture.

An image sensor designated BA including the image sensor designated B, wherein the isolation structure includes a trench extended from the backside of the semiconductor substrate; an oxide-based liner disposed in the trench and lining the trench surfaces; a high k material layer disposed in the trench on the oxide-based liner and on a backside surface of the semiconductor substrate; a second dielectric layer disposed in the trench on the a high k material layer; and a filling material disposed in the trench, wherein the filling material is on the second dielectric layer and may fill the trench; wherein the high k material layer and the second dielectric layer are arranged to be extended onto the backside of the semiconductor substrate and underneath the first dielectric layer.

An image sensor designated BB including the image sensor designated B or BA, the first dielectric layer being disposed between the metal grid and the filling material of the isolation structure.

An image sensor designated BC including the image sensor designated B, BA, or BB wherein the first photodiode has a first full well capacity being less a second full well capacity of the second photodiode.

An image sensor designated BD including the image sensor designated B, BA, BB, or BC further including a neutral-density filters in the first aperture and the first opening of the first dielectric layer that are aligned with the first photodiode, and a first color filter in the first aperture on the neutral-density filter; and a second color filter in the second aperture. In this image sensor, wherein the metal grid separates the first and the second color filters; the first openings of the first dielectric layer have a shape following a shape of the first aperture, and the second opening of the first dielectric layer has a shape following a shape of the second aperture.

A method designated C of fabricating a backside-illuminated image sensor includes forming a trench from a backside surface of a semiconductor substrate and between a first photodiode and a second photodiode in the semiconductor substrate; depositing an oxide-based liner material layer to line the trench; depositing a first process stop layer into the trench on the oxide-based liner material layer and on the backside surface of the semiconductor substrate; depositing a filling material into the trench and on the backside surface of the semiconductor substrate forming an isolation structure; polishing the backside surface of the semiconductor substrate, for example by applying a chemical-mechanical polishing process, to remove the filling material outside the trench on the backside surface of the semiconductor substrate; depositing a second process stop layer on the backside surface of the semiconductor substrate and on the first process stop layer; forming a metal grid on the second process stop layer, wherein the metal grid defines a first aperture aligning with the first photodiode and a second aperture aligning with the second photodiode; and removing portions of the second process stop layer within the first aperture and the second aperture of the metal grid.

A method designated CA including the method designated C and further including depositing a neutral-density filters in the first aperture and depositing a first color filter in the first aperture on the neutral-density filter; and depositing a second color filter in the second aperture without a neutral density filter; where the metal grid separates the first and the second color filters.

A method designated CB including the method designated C, or CA further including, prior to depositing the first process stop layer, lining the trench and the backside surface of a semiconductor substrate with a dielectric having a high dielectric constant, such that the dielectric having a high dielectric constant lies underneath the first process stop layer.

A method designated CC including the method designated C, CA, or CB, further including, after formation of the metal grid, depositing a protective oxide layer over the backside surface of the semiconductor substrate; and removing portions of the protective oxide layer from over a photodiode region having the first photodiode and the second photodiode, while leaving the protective oxide layer on the metal grid in the photodiode region and over a peripheral region surrounds the photodiode region.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:

1. A backside-illuminated image sensor comprising:
   a semiconductor substrate;
   a plurality of photodiodes arranged in an array formed in the semiconductor substrate;
   a first dielectric layer disposed on a backside of the semiconductor substrate, the first dielectric layer having a plurality of openings aligning with each of the plurality of photodiodes; and
   a metal grid disposed on the first dielectric layer, the metal grid defining a plurality of apertures aligning with the plurality of photodiodes;
   a plurality of isolation structures, each of the plurality of isolation structures isolating a photodiode from other of the plurality of photodiodes and comprising:
      a trench formed in the backside of the semiconductor substrate,
      an oxide-based liner disposed in the trench, and lining surfaces of the trench;
      a high-k material layer disposed in the trench on the oxide-based liner and on the backside of the semiconductor substrate;
      a second dielectric layer disposed in the trench on the high-k material layer; and
      a dielectric filling material disposed in the trench, the filling material surrounded by the second dielectric layer;
   the first dielectric layer being disposed between the metal grid and the dielectric filling material of each of the plurality of isolation structures;
   a backside contact structure extending through the semiconductor substrate, the backside contact structure disposed within a peripheral region that surrounds an active pixel region including the array;
   the metal grid including a portion extending from the active pixel region into the peripheral region proximate to the backside contact structure and a third dielectric layer is disposed between the portion of the metal grid extending from the active pixel region into the peripheral region and the backside contact structure, the third dielectric layer being formed of a material different from the first dielectric.

2. The backside-illuminated image sensor of claim 1, a distance between the metal grid and a backside surface of the semiconductor substrate being greater than zero but less than eighty nanometers.

3. The backside-illuminated image sensor of claim 1, the metal grid being aligned with the plurality of isolation structures.

4. The backside-illuminated image sensor of claim 1, the first dielectric layer being disposed between the metal grid and the filling material of each trench.

5. The backside-illuminated image sensor of claim 1, the high-k material layer comprising aluminum oxide or tantalum oxide.

6. The backside-illuminated image sensor of claim 1, wherein the first dielectric layer has a thickness ranged between one nanometer to twenty nanometers.

7. The backside-illuminated image sensor of claim 1, the first dielectric layer being an etch-stop layer and comprising a material having an etching selectivity over the metal grid.

8. The backside-illuminated image sensor of claim 7, the first dielectric layer comprising at least one of silicon nitride, silicon carbide or hafnium oxide.

9. The backside-illuminated image sensor of claim 1, wherein the plurality of openings includes a first group of openings that are aligned with a first group of photodiodes, and a second group of openings aligning with a second group of photodiodes, wherein each photodiode in the first group of photodiodes has a first full well capacity less than a second full well capacity of each photodiode in the second group of photodiodes.

10. The backside-illuminated image sensor of claim 9, further comprising:
    a plurality of neutral-density filters in the first group of openings and wherein the second group of openings lacks neutral-density filters; and
    a plurality of color filters in the first group of openings and in the second group of openings, wherein the metal grid separates adjacent color filters.

11. The backside-illuminated image sensor of claim 1 wherein the first dielectric layer is an etch-stop layer comprising silicon carbide (SiC), or hafnium oxide (HfO2), of thickness between one and twenty nanometers.

12. The backside-illuminated image sensor of claim 1 wherein the third dielectric is a hard mask layer.

13. The backside-illuminated image sensor of claim 12, the third dielectric comprising silicon nitride.

14. An image sensor, comprising:
    a first photodiode disposed in a semiconductor substrate;
    an isolation structure disposed in the semiconductor substrate adjacent the first photodiode, the isolation structure extending from a backside of the semiconductor substrate into the semiconductor substrate and electrically isolating the first photodiode and any adjacent devices;
    a metal grid disposed on the backside of the semiconductor substrate, the metal grid defining a first aperture aligning with the first photodiode, the metal grid being vertically aligned with the isolation structure; and
    a first dielectric layer disposed on the backside of the semiconductor substrate and between the metal grid and isolation structure, wherein the first dielectric layer has a first opening aligning with the first aperture;
    the isolation structures comprising:
       a trench formed in the semiconductor substrate;
       an oxide-based liner disposed in the trench and lining surfaces of the trench;

a high-k material layer disposed in the trench on the oxide-based liner and on the backside of the semiconductor substrate;

a second dielectric layer disposed in the trench on the high-k material layer; and a dielectric filling material disposed in the trench, the filling material surrounded by the second dielectric layer;

wherein the high-k material layer and the second dielectric layer are arranged to be extended onto the backside of the semiconductor substrate and underneath the first dielectric layer;

a backside contact structure extending through the semiconductor substrate, the backside contact structure disposed within an peripheral region that surrounds an active pixel region including the first photodiode;

the metal grid including a portion extending from the active pixel region into the peripheral region proximate to the backside contact structure and a third dielectric layer is disposed between the portion of the metal grid extending from the active pixel region into the peripheral region and the backside contact structure, the third dielectric layer being formed of a material different from the first dielectric.

15. The image sensor of claim 14, a distance between the metal grid and a backside surface of the semiconductor substrate being greater than zero but less than eighty nanometers.

16. The image sensor of claim 14, further comprising a second photodiode disposed in the semiconductor substrate adjacent to the first photodiode;

wherein the first photodiode has a first full well capacity being less than a second full well capacity of the second photodiode.

17. The image sensor of claim 16, wherein the metal grid defines a second aperture aligning with the second photodiode, and the first dielectric layer has a second opening aligning with the second photodiode, the image sensor further comprising:

a neutral-density filter in the first aperture and the first opening of the first dielectric layer that are aligned with the first photodiode, and a first color filter in the first aperture on the neutral-density filter; and a second color filter in the second aperture;

wherein the metal grid separates the first and the second color filters;

wherein the first openings of the first dielectric layer has a shape following a shape of the first aperture and the second opening of the first dielectric layer has a shape following a shape of the second aperture.

18. The image sensor of claim 14 wherein the first dielectric layer is an etch-stop layer comprising silicon carbide (SiC), or hafnium oxide (HfO2) of thickness between one and twenty nanometers.

* * * * *